United States Patent [19]
Lane et al.

[11] Patent Number: 5,985,785
[45] Date of Patent: Nov. 16, 1999

[54] COMPOSITION INCLUDING A CATALYTIC METAL-POLYMER COMPLEX AND A METHOD OF MANUFACTURING A LAMINATE PREFORM OR A LAMINATE WHICH IS CATALYTICALLY EFFECTIVE FOR SUBSEQUENT ELECTROLESS METALLIZATION THEREOF

[75] Inventors: Scott A. Lane, Memphis; Charlie F. Yancey, Germantown, both of Tenn.

[73] Assignee: Alpha Corporation, Collierville, Tenn.

[21] Appl. No.: 08/367,018

[22] Filed: Dec. 30, 1994

Related U.S. Application Data

[60] Division of application No. 08/070,775, Jun. 3, 1993, Pat. No. 5,419,954, which is a continuation-in-part of application No. 08/013,320, Feb. 4, 1993, abandoned.

[51] Int. Cl.$^6$ ........................................................ B01J 31/06
[52] U.S. Cl. ............................ 502/159; 502/170; 502/344
[58] Field of Search ............................ 502/159, 170, 502/344

[56] References Cited

U.S. PATENT DOCUMENTS

| | | | |
|---|---|---|---|
| 2,702,253 | 2/1955 | Bergström et al. | 117/47 |
| 3,011,920 | 12/1961 | Shipley, Jr. | 117/213 |
| 3,124,550 | 3/1964 | Salgado et al. | |
| 3,226,256 | 12/1965 | Schneble, Jr. et al. | 117/212 |
| 3,546,009 | 12/1970 | Schneble, Jr. et al. | 117/212 |
| 3,560,257 | 2/1971 | Schneble, Jr. et al. | 117/212 |
| 3,600,330 | 8/1971 | Schenble, Jr. et al. | 252/430 |
| 3,625,758 | 12/1971 | Stahl et al. | 117/212 |
| 3,930,109 | 12/1975 | Brandt et al. | 428/422 |
| 3,993,807 | 11/1976 | Stabenow et al. | 427/229 |
| 4,021,314 | 5/1977 | Dafter, Jr. | 204/30 |
| 4,035,500 | 7/1977 | Dafter, Jr. | 427/261 |
| 4,169,113 | 9/1979 | Passalenti et al. | |
| 4,248,921 | 2/1981 | Steigerwald et al. | 428/148 |
| 4,253,875 | 3/1981 | Heymann et al. | 106/1.26 |
| 4,317,856 | 3/1982 | Huthwelker et al. | 428/273 |
| 4,420,509 | 12/1983 | Barrell et al. | 427/206 |
| 4,446,173 | 5/1984 | Barrell et al. | 427/206 |
| 4,493,861 | 1/1985 | Sirinyan et al. | 427/304 |
| 4,575,467 | 3/1986 | Sirinyan et al. | 427/304 |
| 4,587,161 | 5/1986 | Barrell et al. | 428/288 |
| 4,659,592 | 4/1987 | Sirinyan et al. | 427/304 |
| 4,661,384 | 4/1987 | Sirinyan et al. | 427/304 |
| 4,727,050 | 2/1988 | Tamblyn et al. | 502/159 |
| 4,830,714 | 5/1989 | Sirinyan et al. | 204/24 |
| 4,832,989 | 5/1989 | Gieseke et al. | 427/306 |
| 5,026,675 | 6/1991 | Braca et al. | 502/159 |
| 5,045,436 | 9/1991 | Tieke et al. | 430/315 |
| 5,135,779 | 8/1992 | Viehbeck et al. | 427/304 |
| 5,217,760 | 6/1993 | Yang | 502/165 |

FOREIGN PATENT DOCUMENTS

| | | |
|---|---|---|
| 2 360 628 | 3/1978 | France . |
| 1 073 135 | 1/1960 | Germany . |
| 355 291 | 8/1961 | Switzerland . |
| 529 180 | 9/1976 | U.S.S.R. . |

*Primary Examiner*—Elizabeth D. Wood
*Attorney, Agent, or Firm*—John W. Schneller; Venable

[57] ABSTRACT

The inventive method provides a simple and economical method of manufacturing a laminate which is catalytically effective for subsequent electroless deposition thereon of metals, such as copper, and which is useful as a substrate for printed circuit boards. Advantageously, the inventive method provides an improved laminate having a substantially uniform distribution of finely divided catalytic metal, $Me_{(O)}$, within a crosslinked synthetic polymer impregnant. A catalytic metal-polymer complex is formed between a salt of a catalytic metal and a crosslinkable synthetic polymer, optionally containing a monomeric reactive diluent, to provide a concentrate which may be worked up into an impregnating composition for impregnating reinforcing material therewith. The complex is then destroyed and the catalytic metal, such as palladium-II, reduced to elemental metal, such as palladium metal, $Pd_{(O)}$, during or after crosslinking of the polymer system under conditions effective for crosslinking the polymer system. Preferably destruction and reduction occur during crosslinking. The catalytic metal is a Group IB or Group VIII metal, preferably palladium or nickel. The crosslinkable synthetic polymer is an unsaturated polyester or polyvinyl ester.

14 Claims, 1 Drawing Sheet

COMPOSITION INCLUDING A CATALYTIC METAL-POLYMER COMPLEX AND A METHOD OF MANUFACTURING A LAMINATE PREFORM OR A LAMINATE WHICH IS CATALYTICALLY EFFECTIVE FOR SUBSEQUENT ELECTROLESS METALLIZATION THEREOF

CROSS-REFERENCE TO RELATED APPLICATION

This Application is a Division of application Ser. No. 08/070,775 filed Jun. 3, 1993 which is a Continuation-In-Part of U.S. application Ser. No. 08/013,320 filed Feb. 4, 1993, now abandoned.

BACKGROUND OF THE INVENTION

1. Field of the Invention

This invention relates to a composition including a novel catalytic metal-polymer complex which is useful in a method of manufacturing a laminate preform or a laminate. The laminate is catalytically effective for subsequent electroless metallization thereof and is useful, for example, as a substrate for printed circuit boards. In particular, the invention relates to a method in which reinforcing material is impregnated with a composition including a crosslinkable synthetic polymer complexed with a salt of a Group IB or Group VIII metal, and the complex is destroyed and the metal reduced to finely divided elemental metal during or after crosslinking of the polymer.

2. Background of the Art

Electrically insulating substrates may be made surface active to chemical metallization, that is, electroless deposition thereon of metal such as copper by two basic techniques. Electroless deposition of metals is well known in the art, see, for example, U.S. Pat. No. 3,560,257 to F. W. Schneble, Jr., et al., the disclosure of which is incorporated herein by reference. The substrate may be filled, i.e., fabricated to contain, a dispersed filler comprising a metal catalytic to the deposition of the electroless metal as is known from, for example, U.S. Pat. No. 3,549,009 to F. W. Schneble, Jr., et al. Alternatively, a substrate free of metal catalyst may have its surfaces activated by immersion of the substrate in a solution containing a salt of a Group IB or Group VIII metal as is known from, for example, U.S. Pat. No. 2,702,253 to Bergstrom or U.S. Pat. No. 3,011,920 to Shipley, or in a solvent-metal complex as described, for example, in U.S. Pat. No. 4,575,467 to Sirinyan.

Substrates fabricated to contain a small percentage catalytic metal according to the prior art, however, exhibit certain deficiencies. Catalytic metal coated fillers according to U.S. Pat. No. 3,546,009, for example, are known to yield substrates having an uneven distribution of the catalytic metal coated filler therein resulting from the relatively high specific gravity and tendency to settle of such fillers. Uneven filler distribution is known to cause bowing and twisting problems within the resulting substrate. Moreover, uneven metal distribution is known to cause varying rates of electroless metal deposition, for example, onto sidewall surfaces of throughbores in the substrate, during electroless metallization. Employing catalytic metal coated fillers additionally tends to produce a substrate surface that is polymer-rich and catalytic metal-deficient. Consequently, it is common to coat such substrates with a catalyst-containing adhesive coating. The coating step is tedious, however, and a common source of defects.

Substrates-surface activated according to the prior art by immersion in a colloidal suspension or solution containing a catalytic metal salt also exhibit certain deficiencies. Surface activation often leads to poor adhesion of the metal subsequently deposited by electroless metallization onto the surface of the substrate due to the weak adhesion of the interboundary layer of activator (e.g., palladium or nickel) to the substrate. Thus, the surface activation technique frequently includes the steps of mechanical roughening or chemical etching of the surface prior to surface activation. Such roughening is known to degrade the surface due to the undesirable formation of cavities, the presence of which tends to occlude some etchant, for example, an etchant including chromic and sulfuric acids, which then passivates that particular site and inhibits or prevents metallization. Moreover, substrates frequently have numerous throughbores of varying size provided therein. These throughbores are drilled to form through-hole circuitry upon metallization but, having high aspect ratios and/or being made of highly hydrophobic materials, the sidewall surfaces of such holes are difficult to wet during immersion and, consequently, difficult to activate uniformly.

Thus, for example, U.S. Pat. No. 4,493,861 to K. Sirinyan et al., teaches surface activation of substrates for currentless metallization by wetting the surface to be metallized with a palladium-II organic compound dissolved in a solvent, removing the solvent, and reducing the palladium-II organic compound adhering to the surface to be metallized. The organic moiety of the palladium-II organic compounds is an oligomeric, prepolymeric or polymeric compound of conjugated dienes or an unsaturated polyester. The compound is a complex formed by reaction of organic metallic compounds with the oligomeric, prepolymeric or polymeric compound, the reaction being accompanied by ligand exchange.

In U.S. Pat. No. 4,317,856 to D. Huthwelker et al., an aqueous solution of a compound of a metal of Group VIII or Group IB is added to a resin solution for impregnating an insulating material or to the adhesive of one or more adhesive layers applied to the insulating material. The aqueous solution may be, for example, a solution of palladium chloride ($PdCl_2$) in water, which preferably contains a small amount of ammonium chloride. The aqueous solution may be added to a resin impregnating solution including a polyester resin, an epoxy resin, a polyepoxy resin, a phenol-resol resin, or a phenol-formaldehyde resin. The solution may be used to impregnate a paper web or glass-fibers to provide a prepreg which may be processed on a hot press into laminates useful as printed circuit boards.

Aqueous solutions of catalytic metal compounds are not compatible or have only a limited compatibility with synthetic polymers, however. Solvent systems have uniformity problems, particularly for thick layers where the solvent is driven off non-uniformly.

It is therefore an object of the present invention to provide an improved method of manufacturing a laminate which is catalytically effective for subsequent electroless metallization thereof and which has finely divided particles of catalytic metal, $Me_{(o)}$, uniformly distributed therein without any substantial settling, a concentrate and composition useful in the method, and a laminate or laminate preform manufactured by the method.

SUMMARY OF THE INVENTION

This and other objects are accomplished by the present invention which provides a concentrate comprising a catalytic metal-polymer complex formed between at least one salt of a catalytic metal and at least one crosslinkable synthetic monomer or polymer, wherein the at least one salt is a salt of a catalytic metal selected from the group consisting of a metal of Group IB and a metal of Group VIII of the Periodic Table of the elements, and wherein the at least one crosslinkable synthetic monomer or polymer is one of (a) a polymer selected from the group consisting of an unsaturated polyester and a polyvinyl ester, and (b) a monomer which contains a double bond and which is a reactive diluent compatible with unsaturated polyesters and polyvinyl esters.

The present invention additionally provides a composition, comprising a concentrate as described above and at least one additional substance selected from the group consisting of additional said polymer, additional said monomer, a solvent, and a crosslinking agent.

The present invention additionally provides a laminate preform, comprising at least one layer of reinforcing material; and an impregnating composition as described above applied to the at least one layer of reinforcing material, wherein the laminate preform includes said at least one crosslinkable synthetic polymer as a B-stage polymer, i.e., partially crosslinked.

The present invention additionally provides a laminate which is catalytically effective for subsequent electroless metallization thereof, comprising at least one layer of reinforcing material impregnated with at least one crosslinked synthetic polymer containing finely divided particles of at least one catalytic metal, as elemental metal, uniformly distributed therein, wherein the at least one crosslinked synthetic polymer is selected from the group consisting of an unsaturated polyester and a polyvinyl ester, and optionally a monomer which contains a double bond and which is a reactive diluent compatible with unsaturated polyesters and polyvinyl esters, wherein the at least one metal is selected from the group consisting of a metal of Group IB and a metal of Group VIII of the Periodic Table of the elements, and wherein essentially no settling of the finely divided particles of at least one catalytic metal has occurred.

The present invention additionally provides a method of manufacturing a laminate preform, comprising admixing at least one salt of a catalytic metal selected from the group consisting of a metal of Group IB and a metal of Group VIII of the Periodic Table of the elements with at least one crosslinkable synthetic monomer or polymer to form a catalytic metal-polymer complex therebetween and provide a concentrate, wherein the at least one crosslinkable synthetic monomer or polymer is one of (a) a polymer selected from the group consisting of an unsaturated polyester and a polyvinyl ester, and (b) a monomer which contains a double bond and which is a reactive diluent compatible with unsaturated polyesters and polyvinyl esters; admixing the concentrate with at least one additional substance selected from the group consisting of an unsaturated polyester and a polyvinyl ester, (b) a crosslinkable monomer which contains a double bond and which is a reactive diluent compatible with unsaturated polyesters and polyvinyl esters, (c) a solvent, and (d) a crosslinking agent, to provide an impregnating composition, which impregnating composition includes said at least one crosslinkable synthetic polymer; impregnating at least one layer of reinforcing material with the impregnating composition; and partially crosslinking said at least one crosslinkable polymer, along with any monomer present, to a B-stage polymer to thereby provide a laminate preform.

The present invention additionally provides a method of manufacturing a laminate, comprising admixing at least one salt of a catalytic metal selected from the group consisting of a metal of Group IB and a metal of Group VIII of the Periodic Table of the elements with at least one crosslinkable synthetic monomer or polymer to form a catalytic metal-polymer complex therebetween and provide a concentrate, wherein the at least one crosslinkable synthetic monomer or polymer is one of (a) a polymer selected from the group consisting of an unsaturated polyester and a polyvinyl ester, and (b) a monomer which contains a double bond and which is a reactive diluent compatible with unsaturated polyesters and polyvinyl esters; admixing the concentrate with at least one additional substance selected from the group consisting of (a) a crosslinkable synthetic polymer selected from the group consisting of an unsaturated polyester and a polyvinyl ester, (b) a monomer which contains a double bond and which is a reactive diluent compatible with unsaturated polyesters and polyvinyl esters, (c) a solvent, and (d) a crosslinking agent to provide an impregnating composition, which impregnating composition includes said at least one crosslinkable synthetic polymer; impregnating at least one layer of reinforcing material with the impregnating composition; crosslinking the at least one crosslinkable synthetic monomer or polymer to a C-stage polymer; and destroying the catalytic metal-polymer complex and reducing the catalytic metal to elemental metal to provide a finished laminate comprised of at least one layer of reinforcing material impregnated with at least one crosslinked synthetic polymer containing finely divided particles of at least one catalytic metal, as elemental metal, uniformly distributed therein, whereby the laminate is made catalytically effective for subsequent electroless metallization thereof.

The inventive method may be a continuous or a batch lamination process, such as the well-known press lamination process employing pressure and/or heat. Continuous lamination processes are also well known, such as those described in U.S. Pat. Nos. 4,420,509; 4,446,173; and 4,587,161 to Barrell et al., the disclosures of which are incorporated herein by reference.

BRIEF DESCRIPTION OF THE DRAWING

The invention may be better understood by referring to the detailed description of the invention when taken in conjunction with the accompanying drawing in which.

DETAILED DESCRIPTION OF THE PREFERRED EMBODIMENTS

Figure 1:
FIG. 1 is a cross-sectional view of a laminate preform according to the invention.

The inventive method provides a simple and economical method of manufacturing a laminate which is catalytically effective for subsequent electroless deposition thereon of metals, such as copper, and which is useful as a substrate for printed circuit boards. Advantageously, the inventive method provides an improved laminate having a substantially uniform distribution of finely divided catalytic metal, $Me_{(0)}$, within a crosslinked synthetic polymer impregnant. A "catalytic metal" as used herein refers to a metal which is catalytic for electroless deposition and which is selected from Group IB or Group VIII of the Periodic Table of the elements. Preferably the catalytic metal is at least one of palladium or nickel. A catalytic metal-complex is formed between a salt of a catalytic metal and a crosslinkable synthetic polymer, optionally containing a monomeric reactive diluent, to provide a concentrate which may be worked up into an impregnating composition for impregnating reinforcing material therewith. The complex is then destroyed and the catalytic metal, such as palladium-II, reduced to elemental metal, such as palladium metal, $Pd_{(O)}$, during or after crosslinking of the polymer system under conditions effective for crosslinking the polymer system. Preferably destruction and reduction occur during crosslinking. As used herein, "polymer system" refers to the at least one crosslinkable synthetic polymer selected from the group consisting of an unsaturated polyester and a polyvinyl ester, and any monomeric reactive diluent.

In order for the crosslinkable synthetic monomer or polymer to form a complex in situ with a salt of a catalytic metal, the polymer and/or monomer (reactive diluent containing a double bond) is charged into a mixer, such as a ball mill or a three-roll mill, preferably into a high shear mixer, such as a Cowles mixer, and particles of the catalytic metal salt are then added to the mixer. While the complex will form in about three days if the salt is simply stirred into the monomer or polymer and allowed to sit, ball milling induces formation of the complex in about 6 to 10 hours, and high shear mixing induces formation of the complex in from about 0.5 to 2 hours. While any of various types of such mixers may be employed, it is preferable for the mixer to be operating at high speed during the addition. Ultrasonic mixers also greatly aid the formation of the complex, and most preferably a high shear mixer and an ultrasonic mixer are used in combination. The complex is soluble in the polymer system and adequate mixing is achieved when the catalytic metal salt particles are no longer visible. The application of heat is to be avoided. The concentrates and compositions according to the invention are formulated entirely without the application of heat other than that generated in the mixing means. For palladium salts, for example, heating to about 80° C. caused undesirable formation of a colloidal suspension instead of the soluble complex sought by the present invention.

It is beneficial to grind the catalytic metal salt, such as in a mortar and pestle, ball mill, three-roll mill, or dry Cowles mixer prior to admixing. It is preferable to grind the catalytic metal salt to a fine powder along with an anticaking agent. Any of the well-known anticaking agents may be used, such as CABOSIL (fumed silica), however, a preferred anticaking agent is MAGNESOL POLYSORB 40/50 made by the Dallas Group of America. While a broad range of ratios of anticaking agent to catalytic metal salt may be used, a preferred range is from 2:1 to 25:1 parts by weight, most preferably from 4:1 to 10:1 parts by weight, of anticaking agent to catalytic metal salt.

A broad range of catalytic metal salt amounts may be employed in the polymer systems according to the invention. Indeed, any amount effective to result in an adequate concentration of elemental catalytic metal in the finished laminate may be employed. An adequate concentration is one which is effective for electroless metallization of the laminate. Ratios of from about 0.01 to about 50 grams of catalytic metal salt per 1000 grams of polymer system, i.e., the at least one crosslinkable synthetic polymer and any monomer-reactive diluent, are typically combined to produce complexes of various concentrations, depending on the target concentration in the impregnating composition. Preferably from about 1 to about 20 grams of catalytic metal salt per 1000 grams of polymer system are employed, most preferably from about 5 to about 15, especially about 10.

Although any inorganic or organic catalytic metal salt which is compatible with the polymer system may be employed, preferred salts for this invention include metal halides, such as chlorides, and metal salts of organic acids, i.e, organic carboxylates, such as acetates, of Group IB and Group VIII metals. The salts of organic acids are preferred over the halides due to the absence of hydrolyzable halides upon destruction of the complex and reduction of the metal to the elemental metal, $Me_{(O)}$. The salts of organic acids include, but are not limited to, formate, acetate, propionate, butyrate, and valerate, and these, as well as the halides may be prepared by any of several well-known methods.

The existence of the complex is affirmed by solubilization of the salt particles and by a color change in the polymer composition. Catalytic metal salts, such as palladium salts, are generally insoluble or only very poorly soluble in the polymer system, while the complex is soluble. Thus, for example, the color of a clear polymer will change to a clear golden brown upon complexation with the catalytic metal salts of the invention and the catalytic metal salt particles will no longer be visible. The solubility of the complex ultimately results in a small particle size being obtained for the elemental metal, after complex destruction and reduction of the metal to the elemental metal, on the order of less than 1.0 micrometers, such as from about 0.1 to about 1.0 micrometers, which thereby reduces settling and promotes uniformity of distribution. The change of color into the visible seems to indicate that a coordination compound or complex compound or complex is formed.

The crosslinkable synthetic polymers suitable for the present invention are unsaturated polyesters and unsaturated polyvinyl esters. These polymers contain functional groups such as an allyl group, an ether group, and an ester group, the presence of which has been found to result in the formation of the desired catalytic metal-polymer complex. A concentrate of the complex may be formed with an effective amount of such polymers which may then be worked up into a composition suitable as an impregnating composition by the addition of further ingredients.

Catalytic metal complexes may alternatively be formed with an appropriate monomer containing a double bond, i.e., a reactive diluent, so long as the monomer is compatible with and reacts with the polymer during crosslinking. It is thus possible to prepare a concentrate containing a complex formed between the catalytic metal salt and a monomer containing a double bond, such as styrene. The concentrate may then be worked up into a composition useful either as an impregnating composition or as a coating composition, such as a composition suitable for coating an adhesive layer onto a laminate preform or a finished laminate, by admixing appropriate remaining ingredients.

Solvents compatible with the materials may, of course, be employed to obtain desired viscosity or other characteristics but are not essential and may even be detrimental. If employed, however, any among many known solvents, such as ketones including methyl ethyl ketone, may be employed. The term "solvents" as used herein means a non-reactive diluent. other ingredients may also be included as is known in the art, such as dyes, pigments, extenders, fillers, etc.

The crosslinkable synthetic polymers useful in the invention are polyesters and polyvinyl esters.

Unsaturated polyesters are a preferred synthetic thermoset polymer for the present invention and are condensation polymers formed by the reaction of polycarboxylic acids and polyols, with olefinic unsaturation being contributed by one of the reactants, usually the acid. The polyols and polycarboxylic acids are at least difunctional, i.e., glycols and dicarboxylic acids. The acids can be either aliphatic or aromatic, and the glycols can be aliphatic, branched, or etheric. The polymer is usually diluted with a double-bond-containing monomer, i.e., a reactive diluent, such as styrene.

Suitable polyols include, but are not limited to, glycols of ethylene, diethylene, propylene, dipropylene, dibromoneopentyl, neopentyl, trimethylpentanediol, cyclohexanedimethanol, bisphenol A, propoxylated bisphenol A, and hydrogenated bisphenol A. Dicyclopentadiene, while not a true glycol, may be utilized as such. Hydroxy-terminated elastomers can also be used.

Suitable polycarboxylic acids, i.e, di- and tri-carboxylic acids, include, but are not limited to, maleic, fumaric, nadic, isomers of phthalic (ortho, meta, para), adipic, glutaric, azelaic, chlorendic, and succinic acids. Also suitable are anhydrides including maleic, phthalic, tetrabromophthalic, tetrachlorophthalic, and endomethylene-tetrahydrophthalic anhydrides. Carboxy-terminated elastomers can also be used.

The unsaturated polyester polymer system preferred for the present invention is based upon dicyclopentadiene, maleic acid, diethylene glycol, and propylene glycol diluted with a double-bond-containing monomer, i.e., a reactive diluent, such as styrene monomer. For example, a preferred polymer includes 0.5 moles of dicyclopentadiene, 1 mole of maleic acid, 0.8 moles of diethylene glycol, and 0.1 moles of propylene glycol.

Polyvinyl esters are an additional preferred synthetic thermoset polymer for use in the present invention and are the reaction products of epoxy resins with ethylenically unsaturated carboxylic acids. Simple diepoxide resins can be further extended with bisphenol A to form higher molecular weight analogs. Suitable polymer chain extenders include, but are not limited to, bisphenol A, bisphenol F, or hydroxy-terminated elastomers.

Suitable epoxy resins include, but are not limited to, diglycidyl ethers of bisphenol A or bisphenol F, phenol-formaldehyde novolacs, or any epoxy. Epoxy-terminated elastomers can also be utilized.

Suitable ethylenically unsaturated carboxylic acids include, but are not limited to, acrylic, methacrylic, crotonic, and cinnamic acids.

The polyvinyl ester polymer system preferred for the present invention is that of a diglycidyl ether of bisphenol A, whose chain is extended with bisphenol A and terminated with methacrylic acid moiety, and diluted with styrene monomer. For example, a preferred polymer includes 1.8 moles of a diglycidyl ether of bisphenol A, such as EPON 828 from Shell Chemical Co., 0.75 moles of bisphenol A, and 1.0 moles of methacrylic acid.

The synthetic polymers employed in the invention are preferably diluted with a reactive diluent monomer to achieve an optimum working viscosity and provide control over the rate of crosslinking during curing. Dilution with an appropriate monomer facilitates impregnation of the reinforcing material and/or the crosslinking of the laminate preform. From about 1 to about 99% by weight of the monomer is employed based on the total percent by weight of the polymer system, preferably from about 25 to about 35%, most preferably about 30%. Formation of a particularly stable complex between the synthetic polymer and the catalytic metal salt is facilitated when a monomer (reactive diluent) is employed which contains at least one double bond.

Suitable monomers (reactive diluents) include, but are not limited to, styrene, dibromo styrene, tribromo styrene, butyl acrylate, methyl methacrylate, ethyl methacrylate, butyl methacrylate, alpha-methyl styrene, vinyl toluene, para-methyl styrene, diallyl phthalate, diallyl isophthalate, octyl acrylamide, trimethylol propane triacrylate, triallyl cyanurate, triallyl isocyanurate, diallyl maleate, diallyl tetrabromophthalate, and divinyl benzene.

The synthetic thermoset polymers useful in the present invention progress through various stages which correspond to the degree of crosslinking experienced. In a first stage, referred to in the art as an "A-stage" because crosslinking has not yet begun, the synthetic polymers, for example, an unsaturated polyester or a polyvinyl ester, are synthesized and optionally thinned by addition of a reactive diluent/monomer if necessary. The A-stage material is crosslinkable and the at least one crosslinkable synthetic polymer which is admixed with a catalytic metal salt to form a catalytic metal-polymer complex therebetween according to this invention is such an A-stage material. The A-stage material may be formulated as an impregnating composition to impregnate reinforcing material to provide a laminate or as a coating composition for a catalyzed adhesive layer for PC Board laminates.

The complex may be formed as a concentrate prior to formulation of a composition according to the invention or at the same time as the composition is formulated. The composition may be formulated as an impregnating composition or as a coating composition and, as such, contains additional ingredients, such as a crosslinking agent. The crosslinking agent, i.e., a crosslinking catalyst, is at least one substance which forms free radicals when the impregnating composition is treated under conditions effective to crosslink the polymer system, such as by means of heat, UV radiation, or electron beam bombardment. Preferably the crosslinking agent is a peroxide, most preferably a mixture of peroxides since this has been found to advantageously more completely crosslink the polymer composition. For example, a preferred crosslinking agent is a mixture of ESPEROX 28 and ESPEROX 10 peroxide catalysts available from Witco Corporation. These peroxide catalysts decompose to form free radicals at different rates which has been found to more completely cure the polymer composition. Preferably from about 0.05 to about 2% by weight of catalyst based on the weight of the polymer system is employed.

When it is desired to initiate crosslinking of the polymer system when, for example, the composition has been used to impregnate reinforcing material and form a laminate preform, the laminate preform is treated under conditions effective to crosslink the at least one synthetic polymer and any reactive diluent-monomers, such as with heat, UV irradiation, or electron beam bombardment. Free radical induced crosslinking of synthetic monomers and polymers is well known in the art, see, for example, the *Handbook of Thermoset Plastics* by Sidney Gordon, Noyes Publications, 1986, the disclosure of which is incorporated herein by reference. When heat is employed in the method of the present invention, heating from about 120 to about 210° C. for from about 15 minutes to about one hour generally suffices to completely crosslink the polymer system, preferably from about 150 to about 200° C. for from about 30 minutes to about one hour, most preferably about 175° C. for about one hour. UV irradiation and electron beam bombardment dosage conditions of intensity and duration are well known in the art and can be readily determined by well-known techniques so that these techniques need not be discussed.

If crosslinking under ambient conditions is desired, promoters and, optionally, copromoters may be used as are well known in the art. Chapter 11 of the Gordon text referenced above describes promoters including soaps of cobalt, tin, manganese, vanadium, calcium, and barium, for example, and describes copromoters including amines, acetonides, acetonates and quaternary salts, for example, which coact with the promoters. Promoters and copromoters may each be used in amounts ranging from about 500 to about 20,000 ppm, i.e., from about 0.05 to about 2 PHR (parts per hundred parts resin, that is, the polymer system).

Treatment generates free radicals within the A-stage material and crosslinking progresses and the polymer goes through a "B-stage". During this progression, the viscosity of the polymer composition increases dramatically and mechanical properties develop. If crosslinking treatment is continued, a "C-stage" results which represents the full crosslinking of the thermoset polymer system. The ultimate mechanical and physical properties of the polymer are achieved at this C-stage. Crosslinking, of course, includes the formation of crosslinks between the crosslinkable synthetic polymer and any monomeric reactive diluent included therein.

The catalytic metal-polymer complex is generally destroyed and the metal reduced to the elemental metal during complete crosslinking of the polymer, that is, treatment to crosslink the B-stage material into the C-stage material. However, it is possible to employ gentle crosslinking conditions, e.g., lower temperatures to obtain complete crosslinking without destruction of the complex and/or without reduction of the metal to the elemental metal. Then, it is possible to achieve destruction and/or reduction by employing more severe treatment conditions, such as higher temperatures and/or longer time periods.

Following the preparation of the catalytic metal-polymer complex, formulation and manufacturing of a laminate proceeds according to conventional techniques. Thus, for example, the impregnating composition containing the complex is utilized in a continuous or batch lamination process as discussed in the foregoing. A laminate produced with the catalytic metal-polymer complex undergoes a noticeable color change during crosslinking of the polymer from the B-stage to the C-stage. The clear golden color of, for example, a palladium-polymer complex will change to a grey color ranging from light to dark grey, which indicates that destruction of the complex and reduction of the palladium to elemental palladium, $Pd_{(O)}$, has occurred.

Prior to reduction of the catalytic metal, the complex is destroyed in one or more of three ways. A double bond in the polymer/monomer which is involved in the structure of the complex may react with a free radical during or after cure to destroy the complex. The complex may be perturbed due to conformational changes in the backbone of the curing polymer and/or by heat generated from the exothermic reaction during crosslinking or by heat, UV irradiation or electron beam bombardment applied to implement crosslinking or thereafter. Partial crosslinking to the B-stage may be accomplished without any substantial destruction of the complex.

For the catalytic metal to be effective as a catalyst for electroless deposition of metals, it must exist as the elemental metal, $Me_{(O)}$. Therefore, destruction of the complex and reduction of the catalytic metal is necessary. Reducing the catalytic metal too early, e.g., prior to at least a partial gelation of the polymer (B-stage), is undesirable because it can give the precipitated $Me_{(O)}$ sufficient time to settle within the laminate preform. On the other hand, if the destruction occurs too late after gelation (as the C-stage is approached), the poor mobility of the catalytic metal-polymer complex in the gelatinous mass may inhibit destruction of the complex and reduction of all of the catalytic metal to $Me_{(O)}$ unless more intense treatment, e.g., higher temperatures and/or longer time periods are employed.

A reducing agent may be included in the impregnating composition to aid or impede the reduction of the catalytic metal once the complex is destroyed during or after crosslinking. Coincidentally, the presence of water, found at trace levels in most synthetic polymer compositions (A-stage), may function as such a reducing agent in suitable amounts. In addition to water, any substance which is compatible with the polymer systems and which will oxidize to donate electrons for reduction may act as the reducing agent. Suitable reducing agents would therefore be readily determinable by the artisan and include, but are not limited to, for example, water, cobalt octate, cobalt napthenate, aluminum isopropoxide, and lithium aluminum hydride.

The concentration and chemical strength of the reducing agent can be tailored to optimize the catalytic metal reduction for a particular impregnating composition. Amounts of reducing agent(s) ranging from about 0.00001 up to about 1,000 ppm are useful. Preferably from about 0.01 to about 15 PHR are used, most preferably from about 5 to about 15 PHR, especially 10 PHR.

Certain materials expedite reduction of the catalytic metal, such as methacrylic acid. Other substances, such as dibromostyrene, stabilize the complex and thereby retard reduction. For example, methacrylic acid was noted to expedite reduction of palladium to $Pd_{(O)}$ and dibromostyrene was noted to stabilize a palladium-unsaturated polyester complex and thus retard reduction.

EXAMPLE 1

500 grams of either an unsaturated polyester or a polyvinyl ester (A-stage) was charged into a Cowles mixer. Exactly 0.5 grams of palladium acetate was prepared by finely grinding same in a mortar and pestle. While the polymer-containing mixer was operated under high shear, the palladium acetate was slowly added. The mixture was allowed to mix under high shear for approximately two hours. After filtration through a 100 micron filter bag, the palladium-polymer complex in concentrate form was ready.

The palladium-polymer complex concentrate was admixed with additional constituents suitable to provide an impregnating composition including 500 grams of additional unsaturated polyester or polyvinyl ester, 165 grams of styrene, and 0.36% by weight of t-butyl peroxy 2-ethylhexanoate based on the total weight of the composition. Fillers and extenders, fire retardants, processing aids, and other performance enhancing additives could also be included as is known in the art.

In the laboratory, a laminate preform was formed between glass plates separated from the impregnating mixture by a carrier film. Thus, a sheet of carrier film, for example, a sheet of MYLAR, a polyethylene teraphthalate, having a thickness of from 1.5 to 7 mil, was placed upon a ⅛ inch thick, heat treated glass plate. From about 100 to about 300 grams of the impregnating composition was poured onto the carrier film, immediately after which about one square foot of from about 1 to about 3 ounces of chopped random mat fiberglass was carefully layed on top of the impregnating composition. The composition penetrates and saturates the glass mat material and a tongue depressor was used to distribute the composition across the glass mat to a thickness of about 0.065 inches. A second sheet of carrier film was placed on top of the laminate preform followed by placement of another glass plate on top of the second carrier film.

The entire sandwich assembly was positioned within a convection oven at from about 200 to about 400° F. for from 10 to 30 minutes to initiate crosslinking and progression of the polymer material through the B-stage and onto the C-stage. After the assembly had cooled, the glass plates and carrier films were removed from the finished laminate. Upon crosslinking, the laminate preform changed color to a dark grey, indicated that destruction of the complex and reduction to palladium metal had occurred, and the final thickness was about 0.059 inches.

The above laminate may then be placed in a copper electroless metallization bath of the type that is well known in the art. Deposition of copper will occur uniformly and at a rate at least equivalent to other catalyst-containing laminates.

EXAMPLE 2

An unsaturated polyester was synthesized by a typical route well known in the art to contain equal molar amounts of maleic acid and diethylene glycol. A 507.73 gram sample of this polymer was placed in a water bath at about 82° C. which melts the polymer and affords a workable viscosity. The molten polymer was mixed with a Cowles blade operated by an air mixer at high shear. A 0.5 gram amount of powdered palladium acetate was added to the molten polymer during mixing. After about 30 seconds of agitation, a palladium complex formed with the molten polymer as indicated by the characteristic color change to a golden brown color, the solubilization of the complex and the disappearance of palladium salt particles.

In order to expedite the crosslinking of the unsaturated polyester, the palladium-polymer mixture was thinned with 217 grams of styrene and cooled to room temperature. About 2% by weight of methyl ethyl ketone peroxide was added to the blend and a casting made. The polymer was cured at 100° C. in a convection oven for one hour and the casting changed from a golden brown color to a dark black color as curing progressed thereby indicating that complex destruction and palladium reduction had occurred.

FIG. 1 shows a laminate preform 1 in cross-section. The preform 1 includes polymer system 2 comprised of a palladium-polymer complex, at least one crosslinkable synthetic polymer and, optionally, a reactive diluent, and a reinforcing material 3 shown as chopped random mat fiberglass. Alternatively, the reinforcing material 3 may be fiberglass roving, fiberglass veil, woven fiberglass, or even paper as is known in the printed circuit board art.

Figure 2:
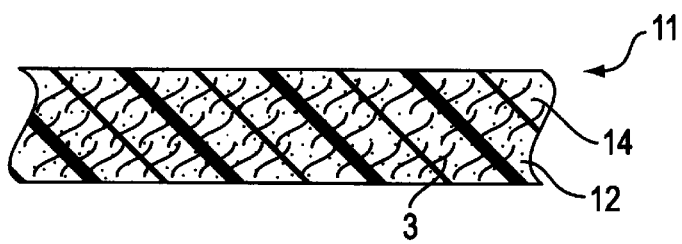
FIG. 2 is a cross-sectional view of a finished laminate according to the invention.

FIG. 2 shows, in cross-section, a finished laminate 11 which results after the polymer system 2 of laminate preform 1 has been crosslinked and the palladium-polymer complex has been destroyed and the palladium reduced to palladium $Pd_{(O)}$ either during or after crosslinking. FIG. 2 thus shows finely divided particles of $Pd_{(O)}$ 14 uniformly distributed in the crosslinked polymer system 12, along with reinforcing material 3.

Figure 3:
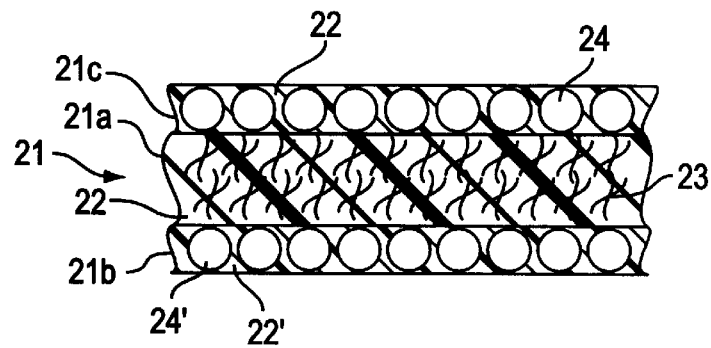
FIG. 3 is a cross-sectional view of a multilayer embodiment of a laminate preform according to the invention.

FIG. 3 shows in cross-section a laminate preform 21 having three impregnated sections 21a, 21b and 21c, all impregnated with polymer system 22 (which may be the same as polymer system 2 in FIG. 1, for example). Section 21a includes reinforcing material 23 shown as fiberglass veil. Sections 21b and 21c are shown as including sheets of woven fiberglass 24.

Figure 4:
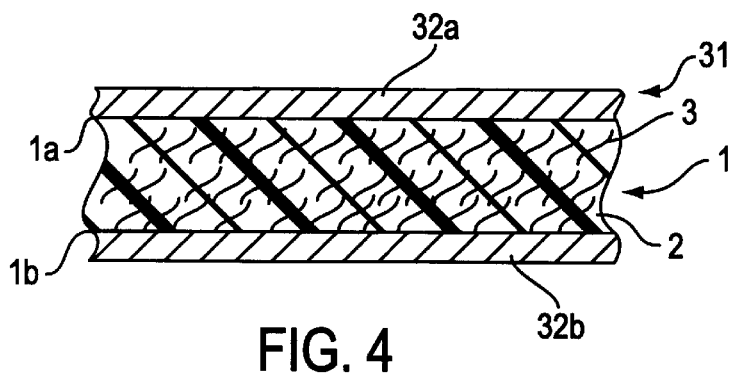
FIG. 4 is a cross-sectional view of the laminate preform of FIG. 1 clad with metal foil on both opposing surfaces thereof.

FIG. 4 shows in cross-section a laminate preform 31 which is metal foil clad on each of a pair of opposing surfaces 1a and 1b. Metal foil 32a, 32b is shown laminated onto opposing surfaces 1a, 1b of an impregnated section 1 which is the laminate preform 1 shown in FIG. 1. Section 1 includes polymer system 2 and reinforcing material 3.

Catalyzed laminates produced according to the present invention advantageously have a more homogenous distribution of catalytic metal, $Me_{(O)}$, and catalytic metal having a finer grain size. Particle sizes for $Pd_{(O)}$, for example, range from 0.2 to 0.4 micrometers compared to conventional $Pd_{(O)}$ coated fillers having 5 to 10 micrometer filler diameter. This results in a substantial cost savings because less catalytic metal is required to achieve the desired catalytic result. For example, a cost reduction of about 20% is possible for a palladium-containing laminate compared to such a laminate prepared by conventional technology, such as a laminate produced according to U.S. Pat. No. 3,546,009.

Moreover, since no metal coated fillers are employed, coated or laminated substrates are produced with less bow and twist. Metal catalyst levels at the surface are more uniform so that laminates according to the invention achieve the desired catalytic result and allow fabrication without the need to additionally employ a catalyzed adhesive coating. Some applications, however, such as metal foil cladding with, for example, copper foil, benefit if a catalyzed adhesive coating is provided.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A concentrate, consisting of:
   a catalytic metal—complex formed between at least one salt of a catalytic metal and at least one crosslinkable synthetic polymer, wherein the at least one salt is a salt of a catalytic metal selected from the group consisting of a metal of Group IB and a metal of Group VIII of the Periodic Table of the elements provided said salt is not carboxylate, and wherein the at least one crosslinkable synthetic polymer is a polymer selected from the group consisting of an unsaturated polyester and a polyvinyl ester each including at least one functional group selected from the group consisting of an allyl group, an ether group, and an ester group.

2. The concentrate according to claim 1, wherein the catalytic metal is selected from the group consisting of palladium and nickel.

3. The concentrate according to claim 1, wherein the at least one salt is a halide.

4. The concentrate according to claim 3, wherein the at least one salt is chloride.

5. The concentrate according to claim 1, wherein the reactive diluent is styrene.

6. A composition, consisting of:
   a concentrate comprised of a catalytic metal—complex formed between at least one salt of a catalytic metal and at least one crosslinkable synthetic polymer, wherein the at least one salt is a salt of a catalytic metal selected from the group consisting of a metal of Group IB and a metal of Group VIII of the Periodic Table of the elements provided said salt is not carboxylate, and wherein the at least one crosslinkable synthetic polymer is a polymer selected from the group consisting of an unsaturated polyester and a polyvinyl ester each including at least one functional group selected from the group consisting of an allyl group, an ether group, and an ester group; and at least one additional substance selected from the group consisting of (a) a crosslinkable synthetic polymer selected from the group consisting of an unsaturated polyester and a polyvinyl ester, (b) a solvent, and (c) a crosslinking agent.

7. The composition according to claim 6, wherein the catalytic metal is selected from the group consisting of palladium and nickel.

8. The composition according to claim 7, wherein the at least one salt is a halide.

9. The composition according to claim 8, wherein the at least one salt is a chloride.

10. The concentrate according to claim 6, wherein the reactive diluent is styrene.

11. The composition according to claim 6, wherein the at least one additional substance includes a crosslinking agent and wherein the crosslinking agent comprises at least one peroxide.

12. The concentrate according to claim 1, wherein the catalytic metal is palladium.

13. The concentrate according to claim 1, wherein said polymer is a polyvinyl ester including at least one functional group selected from the group consisting of an allyl group, an ether group, and an ester group.

14. The composition according to claim 6, wherein said polymer is a polyvinyl ester including at least one functional group selected from the group consisting of an allyl group, an ether group, and an ester group.

* * * * *